(12) United States Patent
Oka et al.

(10) Patent No.: US 9,659,889 B2
(45) Date of Patent: May 23, 2017

(54) SOLDER-ON-DIE USING WATER-SOLUBLE RESIST SYSTEM AND METHOD

(71) Applicant: Intel Corporation, Santa Clara, CA (US)

(72) Inventors: Mihir Oka, Chandler, AZ (US); Xavier Brun, Chandler, AZ (US); Dingying David Xu, Chandler, AZ (US); Edward Prack, Phoenix, AZ (US); Kabirkumar Mirpuri, Scottsdale, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/136,908

(22) Filed: Dec. 20, 2013

(65) Prior Publication Data

US 2015/0179595 A1 Jun. 25, 2015

(51) Int. Cl.
*H01L 23/00* (2006.01)
*C08K 3/36* (2006.01)
(Continued)

(52) U.S. Cl.
CPC ............ *H01L 24/11* (2013.01); *B23K 1/0016* (2013.01); *B23K 1/20* (2013.01); *B23K 26/362* (2013.01); *C08G 73/0233* (2013.01); *C08K 3/22* (2013.01); *C08K 3/36* (2013.01); *C09D 179/02* (2013.01); *H01L 24/13* (2013.01); B23K 2201/42 (2013.01); C08K 2003/2241 (2013.01); H01L 24/05 (2013.01); H01L 2224/0401 (2013.01); H01L 2224/05647 (2013.01); H01L 2224/119 (2013.01); H01L 2224/1132 (2013.01); H01L 2224/1147 (2013.01);
(Continued)

(58) Field of Classification Search
CPC ....... H01L 2924/00; H01L 2924/00014; H01L 2924/00013; H01L 2224/48091; H01L 2224/32225; H01L 2924/01029; H01L 2224/73265; H01L 2224/48227; H01L 2224/81815; H01L 2224/83801; H01L 23/00; H01L 23/49811; H01L 23/3128; H01L 23/49816; H01L 23/3677; H01L 23/4334; H01L 23/49517; H01L 23/49513; H01L 23/5226; C08L 79/04; C08L 77/00; B23K 1/00; B23K 1/20; C08K 3/22; C08K 3/36; C08G 69/00
USPC .......................... 257/741, 620, 690, 701, 774
See application file for complete search history.

(56) References Cited

U.S. PATENT DOCUMENTS

| | | | | |
|---|---|---|---|---|
| 2005/0000730 | A1* | 1/2005 | Happoya | .................... 174/262 |
| 2008/0203477 | A1* | 8/2008 | Yamazaki | ............. H01L 27/105 257/347 |
| 2010/0181650 | A1* | 7/2010 | Shigihara | ............ H01L 21/6836 257/620 |

* cited by examiner

*Primary Examiner* — Chuong A Luu
*Assistant Examiner* — Rodolfo D Fortich
(74) *Attorney, Agent, or Firm* — Schwegman Lundberg & Woessner, P.A.

(57) ABSTRACT

This disclosure relates generally to generating a solder-on-die using a water-soluble resist, system, and method. Heat may be applied to solder as applied to a hole formed in a water-soluble resist coating, the water-soluble resist coating being on a surface of an initial assembly. The initial assembly may include an electronic component. The surface may be formed, at least in part, by an electrical terminal of the electronic component, the hole being aligned, at least in part, with the electrical terminal. The solder may be reflowed, wherein the solder couples, at least in part, with the electrical terminal.

6 Claims, 7 Drawing Sheets

(51) Int. Cl.
    *C08K 3/22*        (2006.01)
    *B23K 1/20*        (2006.01)
    *B23K 1/00*        (2006.01)
    *B23K 26/362*     (2014.01)
    *C09D 179/02*     (2006.01)
    *C08G 73/02*      (2006.01)
    *B23K 101/42*     (2006.01)

(52) U.S. Cl.
    CPC .................. *H01L 2224/1181* (2013.01); *H01L 2224/11334* (2013.01); *H01L 2224/11849* (2013.01); *H01L 2224/131* (2013.01); *H01L 2224/133* (2013.01); *H01L 2224/1339* (2013.01); *H01L 2224/13294* (2013.01); *H01L 2224/13347* (2013.01); *H01L 2224/16145* (2013.01); *H01L 2224/16225* (2013.01); *H01L 2224/81191* (2013.01); *H01L 2924/10253* (2013.01); *H01L 2924/12042* (2013.01)

SOLDER-ON-DIE USING WATER-SOLUBLE RESIST SYSTEM AND METHOD

TECHNICAL FIELD

The disclosure herein relates generally to using a water-soluble resist in making a solder-on-die assembly and related method therefor.

BACKGROUND

Conventional solder-on-die (SoD) chip packages incorporate an input/output terminals made from a conductive material such as copper coupled to a silicon die or other electronic component for transmitting and receiving electronic signals and power to and from the electronic component. In order to couple external components to the chip package, solder or other suitable material is conventionally attached to the terminal. Current processes for the application of solder to the terminal utilize a resist material to form a cavity into which the solder is printed and reflowed to couple the solder to the terminal. The resist is utilized according to a wet chemistry process that includes developing and stripping the resist using organic solvents.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The chemical nature of the organic solvents utilized in conventional SoD processes may create handling challenges. Because such solvents may be strongly oxidizing acids, the solvents be handled, recycled, and disposed of with care. As a result, it may be advantageous for SoD processes to not utilize such solvents.

However, while certain materials that are water-soluble may exist that could serve certain functions of a resist in a SoD process, such materials may have relatively low reflow temperatures. In other words, such materials may be unsuitable for use in a SoD process because such materials are not sufficiently chemically and/or thermally stable for use in an SoD process. As a result, SoD processes have continued to utilize organic solvents notwithstanding the challenges of handling such organic solvents.

A SoD process has been developed that may allow water-soluble resists to be utilized in place of conventional SoD resist materials. Additionally, a water-soluble resist has been developed that has sufficient thermal stability to be utilized in certain SoD processes. As a result, the SoD process and the water-soluble resist material may allow for the creation of SoD chip packages without utilizing organic solvents and which instead utilize water as a solvent.

Figure 1:
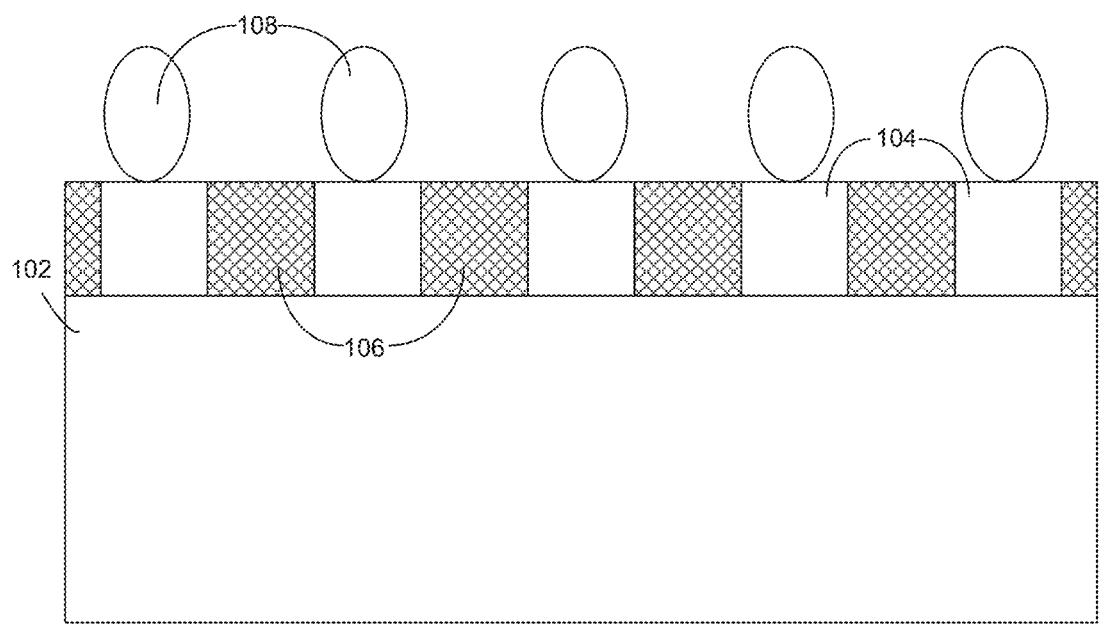
FIG. 1 is an abstract cross-sectional view of an SoD assembly, in an example embodiment.

FIG. 1 is an abstract cross-sectional view of a SoD assembly 100, such as may be made according to the processes and with the materials disclosed herein, in an example embodiment. As illustrated, the SoD assembly 100 includes a silicon die 102 having conductive terminals 104. While a silicon die 102 is illustrated, it is to be recognized and understood that any electronic or microelectronic component may be utilized in place of or in addition to the silicon die 102 herein. In an example, the terminals 104 are copper bumps. In various alternative examples, the terminals 104 are any suitable conductive material in any suitable configuration.

An insulator 106 may provide at least partial physical and/or electrical isolation as well as mechanical stability with respect to the terminals 104. The insulator 106 may be any suitable material, such as a dielectric. Solder connections 108 are electrically and mechanically coupled to the terminals 104 and may provide a mechanism for the assembly 100 to be coupled to various other electronic components and/or circuit boards and vice versa. It is to be recognized and understood that the solder connections 108 may of any suitable material and in any suitable configuration, for instance a solder ball.

FIGS. 2A-2G illustrate a process for making the SoD assembly 100, in an example embodiment. The sequence of the process is not necessarily limiting, and various alternative processes may be utilized to produce the assembly 100 in a manner consistent with this disclosure. Moreover, it is to be recognized that the process may be utilized to create assemblies, systems, and articles in addition to the assembly 100.

Figure 2A:
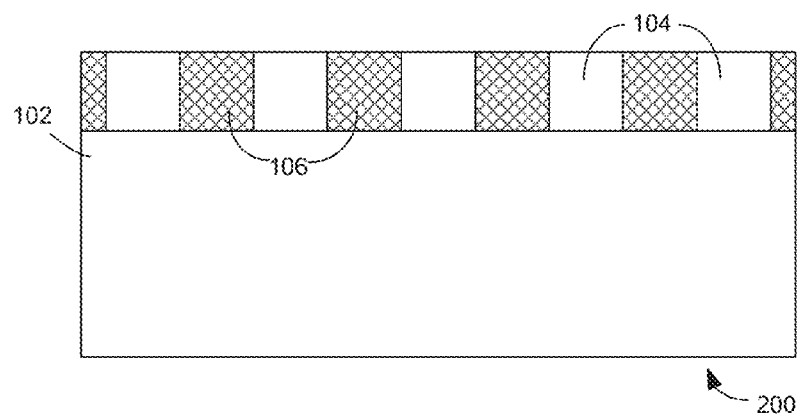
FIGS. 2A-2G illustrate a process for making an SoD assembly, in an example embodiment.

FIG. 2A shows an initial assembly 200 including the silicon die 102 with the terminals 104 and insulator 106. The initial assembly 200 may be obtained as is or may be produced according to any of a variety of suitable processes known or yet to be developed. It is emphasized that the initial assembly 200 is illustrative and that the process disclosed herein with the water-soluble resist may be utilized on any of a variety of initial assemblies 200.

Figure 2B:
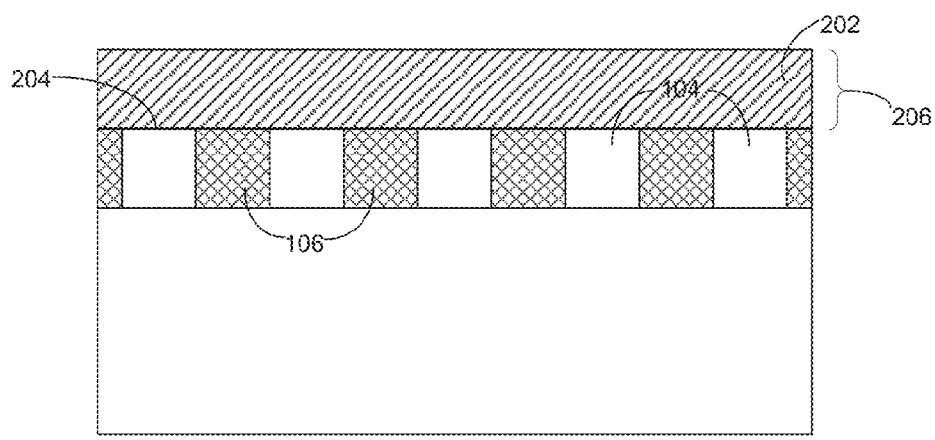

In FIG. 2B, a coating of water-soluble resist 202 is applied to a surface 204 of the initial assembly 200. As illustrated, the surface 204 is formed by the insulator 106 and the terminals 104, though in various examples, various components may form the surface 204 as appropriate to the assembly 100 being formed. The water-soluble resist 202 may be applied to a thickness 206 substantially the same as a height of the solder connections 108 prior to reflowing the solder connections 108, as disclosed herein. The thickness 206 may vary depending on the nature of the assembly 100 being produced.

In various examples, the water-soluble resist 202 is applied using at least one of spin coating and spray coating. In an alternative example, the water-soluble resist 202 is printed on the initial assembly 100. In an alternative example, the water-soluble resist 202 is applied using a slit coating process.

Figure 2C:
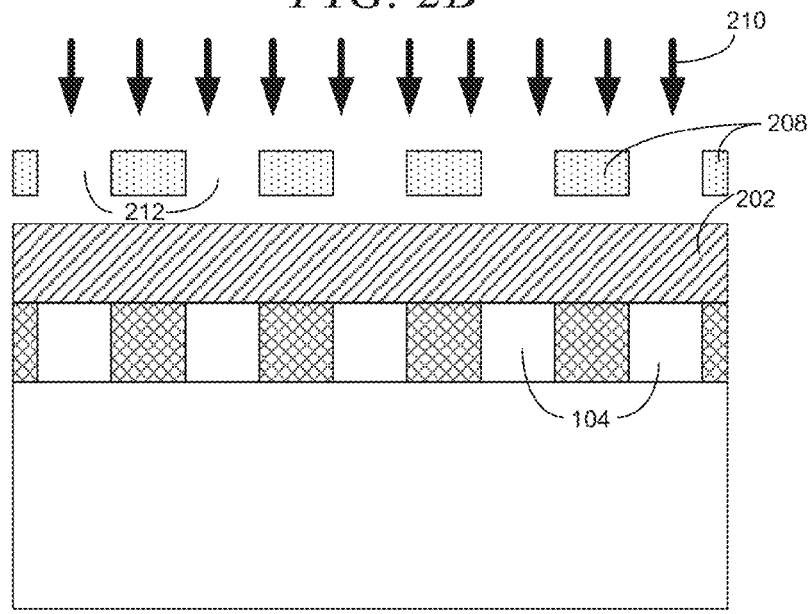

In FIG. 2C, a photo mask 208 that is resilient to laser energy 210 is applied over the water-soluble resist 202 and laser energy is applied to ablate the water-soluble resist 202. The photo mask 208 includes holes 212 that are generally aligned with the terminals 104 and which are configured to provide vias in the water-soluble resist 202 into which solder may be positioned. In various examples, the photo mask 208 and the frequency and intensity of the laser energy 210 are selected based on the properties of the water-soluble resist 202 so that the water-soluble resist 202 is ablated by the laser energy 210 but an overall integrity of the photo mask 208 remains during the ablation process. In an example, the laser energy 210 has a frequency of three hundred eight (308) nanometers. In an example, the laser energy 210 is generated by an excimer laser. In various examples, the water-soluble resist 202 may be modified with dies that absorb light at one or more wavelengths to tune the ablation process and facilitate the absorption of the laser energy 210 by the water-soluble resist 202.

In various alternative examples, the application is laser energy 210 is replaced with any of a variety of processes for forming the via holes. In various examples, any dry patterning process may be utilized, of which laser ablation is one example. In various alternative examples, thermal embossing may be utilized to create the via holes.

Figure 2D:
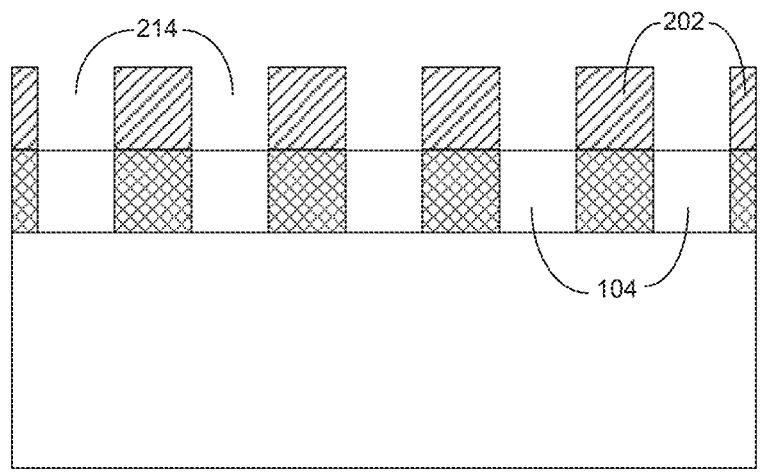

In FIG. 2D, the photo mask 208 is removed, leaving the water-soluble resist 202 with via holes 214 that are substantially aligned with the terminals 104 and the holes 212 in the photo mask 208.

Figure 2E:
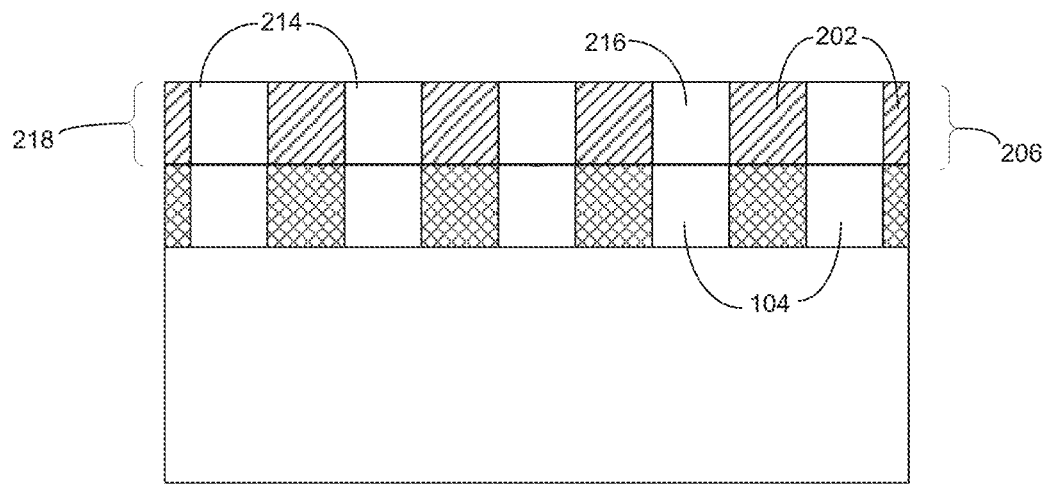

In FIG. 2E, solder precursor 216 is applied in the via holes 214 in the water-soluble resist 202. In various examples, the solder precursor 216 may be applied according to any of a variety of suitable processes, including by placing discrete solder connections into the via holes 214. In an example, the solder precursor 216 is a solder paste 216 that can be applied using solder paste printing. In such an example, a height 218 of the solder paste 216 may be substantially coextensive with the thickness 206 of the water-soluble resist 202.

Figure 2F:
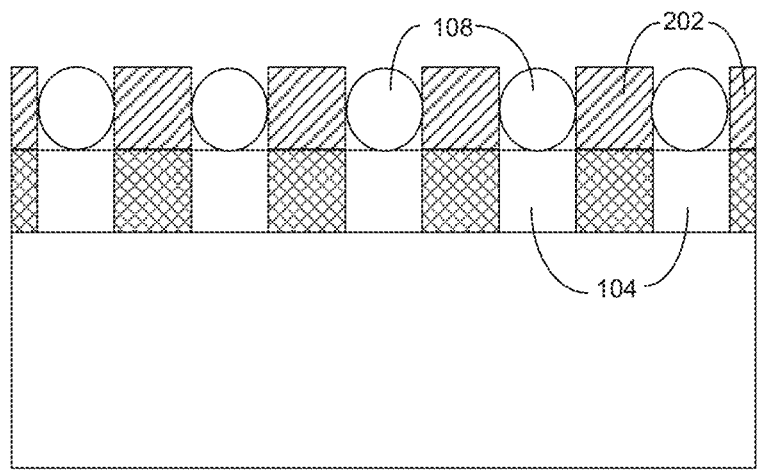

In FIG. 2F, heat is applied to the solder precursor 216, which reflows to form the solder connections 108. In various examples, the heat is applied from an oven, infrared energy source, or other suitable mechanism. In various examples, the solder precursor 216 is heated to at least approximately two hundred forty (240) degrees Celsius. In various examples, the thermal stability of the water-soluble resist 202 may substantially eliminate chemical interaction between the water-soluble resist 202 and the solder precursor 216 during reflowing. The application of heat may be repeated as desired to promote resilient solder connections 108 and resilient coupling between the solder connections 108 and the terminals 104.

Figure 2G:
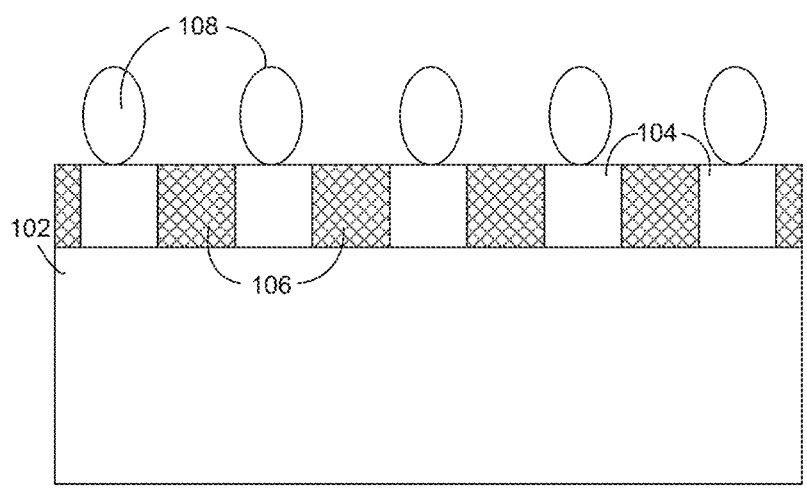

In FIG. 2G, a water wash is applied to the water-soluble resist 202 to remove the water-soluble resist 202, leaving the assembly 100. In an example, the solder paste that forms the solder 216 can also be water-soluble so that the application of the water wash can also remove some or all residue that may remain from the solder 216, such as where the solder 216 is applied as a paste.

The water-soluble resist 202 can be formed from a composition comprising a water-soluble polymer. The water-soluble polymer can be a polymer system that either can form a solution in water or a water-based solvent mixture, or can be removed or washed away using water or a water-based solvent mixture, or both. The dissolution rate of the water-soluble polymer into water can be sufficiently high such that, when desired, the water-soluble resist 202 can be washed away within a relatively rapid period of time to provide for economical throughput of the assembly 100. The dissolution rate of the water-soluble polymer into water can depend on several factors, including, but not limited to, the solubility of the water-soluble polymer in water, the temperature of the water and the water-soluble polymer, the flow rate of the water, and the exposed surface area of the water-soluble polymer.

The water-soluble polymer can be thermally stable up to at least about 240° C., such as at least about 250° C., for example at least about 260° C. In particular, the water-soluble polymer of the resist 202 can be thermally stable at temperatures experienced by the resist 202 during laser ablation, for example, as shown in FIG. 2C. The water-soluble polymer of the resist 202 can also be thermally stable at temperatures experienced by the resist 202 during reflow of the solder precursor 216 to form the solder connections 108, for example, as shown in FIG. 2F.

The water-soluble polymer that forms the water-soluble resist 202 can be substantially unreactive with the materials of the solder precursor 216. For example, some previous forms of dry film resist materials were known to interact with so-called "no clean" solder paste (NC paste) so that the NC paste would swell post-reflow, which would lead to voids in the paste and paste residue on the solder. The paste residue could, in turn, lead to non-wetting and voiding during interconnect joint formation. For example, the water-soluble resist 202 can be configured so that the components of the water-soluble resist 202 (e.g., the water-soluble polymer and any filler or other additives) do not chemically interact or chemically react with any components of the solder precursor 216, such as materials that form a solder paste 216.

In an example, the water-soluble polymer that forms a base of the water-soluble resist 202 can comprise a ring-opened polymer of a heterocyclic organic monomer. The heterocyclic organic monomer can comprise, for example: carbon and nitrogen (e.g., with the heterocyclic ring comprising carbon and nitrogen), carbon and oxygen (e.g., with the heterocyclic ring comprising carbon and oxygen), or carbon, nitrogen, and oxygen (e.g., with the heterocyclic ring comprising carbon, nitrogen, and oxygen). In some examples, the heterocyclic organic monomer can comprise an aromatic heterocyclic compound. The heterocyclic ring can comprise, for example, a four-membered ring, a five-membered ring, a six-membered ring, or more depending on the resulting properties of the monomer and the polymer. Examples of heterocyclic organic monomers include, but are not limited to, oxazolidines, isoxazolidines, oxazoles, isoxazoles, oxazolines, pyrrolidines, pyrroles, tetrahydrofurans, furans, imidazolidines, pyrazolidines, imidazoles, pyrazoles, imidazolines, pyrazolines, triazoles, furazans, oxadiazoles, tetrazoles, piperidines, pyridines, tetrahydropyrans, pyrans, piperazines, diazines, morpholine, and oxazines.

Figure 3A:
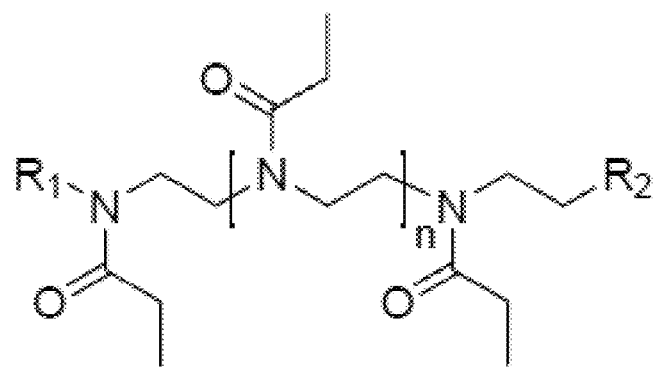
FIG. 3A is a molecular representation of a water-soluble polymer for use in forming a water-soluble resist, in an example embodiment.

In an example, the water-soluble polymer can comprise a poly(2-ethyl-2-oxazoline), which has the general structure shown in FIG. 3A. A commercially available form of poly(2-ethyl-2-oxazoline) is available from Polymer Chemistry Innovations, Inc. of Tucson, Ariz., USA, sold under the trade name AQUAZOL. In such an example, the heterocyclic organic monomer that is polymerized to form the water-soluble polymer can comprise a modified oxazoline, such as 2-ethyl-2-oxazoline, which has the structure shown in FIG. 3B.

The water-soluble polymer can be configured depending on the laser being used for laser ablation of the water-soluble resist 202. For example, the material of the water-soluble polymer can be selected for its absorbance of the particular wavelength of light for the laser being used for ablation. In an example, an ultraviolet (UV) laser, such as an excimer laser, can operate at a laser wavelength of about 308 nanometers (nm). In such an example, the base material of the water-soluble polymer can be selected to have a substantially high absorbance of light at about 308 nm. Additives can also be added to the water-soluble polymer to tune the water-soluble resist 202 to absorbance of light at the specific wavelength of the laser. Examples of additives that can increase absorbance of the laser, such as by increasing absorbance of UV light with a wavelength at and around about 308 nm, include, but are not limited to, dyes and inorganic filler, such as titanium dioxide ($TiO_2$). $TiO_2$ has been shown to modulate the absorption spectra of the water-soluble polymer upon incidence of the ablation laser. $TiO_2$ can also modulate the penetration depth of the ablation laser into the water-soluble polymer, such as by controlling the amount of energy that is absorbed by the water-soluble polymer at the wavelength of the ablation laser.

By modulating the absorption of the ablation laser, the rate of ablation of the water-soluble resist 202 can also be controlled to a certain extent. Improving the speed at which the water-soluble resist 202 can be ablated can reduce the time that the water-soluble resist 202 needs to be exposed to the laser, which in turn can reduce the temperature to which portions of the water-soluble resist 202 that are intended to remain are exposed (e.g., the portions of the water-soluble resist 202 that are not at the position of the via holes 214). Thus, increasing the ablation rate and decreasing the time necessary for ablation of the via holes 214 can provide for a higher likelihood of a stable water-soluble polymer and a thermally and dimensionally stable water-soluble resist 202 during ablation.

In an example, the methods of modulating the absorption of the ablation laser can result in at least about 95% of the energy of the ablation laser can be absorbed by the water-soluble resist 202, such as at least about 96% of the ablation laser energy, for example at least about 97%, at least about 98%, at least about 99%, at least about 99.5%, at least about 99.6%, at least about 99.7%, at least about 99.8%, at least about 99.9%, at least about 99.99%, and at least about 99.999% of the energy of the ablation laser being absorbed by the water-soluble resist 202. In an example, the water-soluble resist 202 can absorb 100% of the energy of the ablation laser at the desired wavelength of the ablation laser.

Ablation rate can be modulated by other means than by modulating absorption of the laser. For example, the molecular weight profile of the water-soluble polymer that forms the water-soluble resist 202 can be modified in order to modulate the ablation rate of the water-soluble resist 202. Generally, the lower the overall molecular weight of the water-soluble polymer, the faster the ablation rate because the laser has less matter per molecule to ablate. The molecular weight of the water-soluble polymer can, therefore, be selected to provide for a desired ablation rate.

The "molecular weight profile," as used herein, can refer to the average molecular weight of the water-soluble resist 202. The "molecular weight profile" can also refer to the relative proportion of various molecular weight grades of the water-soluble polymer that makes up the water-soluble resist 202. For example, a supplier might provide a first grade of the water-soluble polymer having a first average molecular weight, a second grade of the water-soluble polymer having a second average molecular weight, a third grade of the water-soluble polymer having a third average molecular weight, and a fourth grade of the water-soluble polymer having a fourth average molecular weight. For the example water-soluble polymer comprising poly(2-ethy-2-oxazoline), a supplier could provide grades according to the example values of Table 1.

TABLE 1

Example of Water-Soluble Polymer MW Grades

| Grade Number | Average Molecular Weight |
|---|---|
| 1 | 5,000 |
| 2 | 50,000 |
| 3 | 200,000 |
| 4 | 500,000 |

Different blends of the plurality of water-soluble polymer grades can be prepared in order to select a desired ablation rate for the resulting water-soluble resist 202, wherein each blend can be considered a distinct "molecular weight profile."

A change in the molecular weight profile of the water-soluble polymer can also alter the softening temperature of the water-soluble polymer, with a lower molecular weight tending to result in a lower softening temperature and a higher likelihood of the water-soluble polymer melting or deforming during ablation or solder reflow. Therefore, in some examples, a balance between the softening temperature and the ablation rate may be required when selecting the molecular weight of the water-soluble polymer.

Another means for modulating the ablation rate of the water-soluble resist 202 is adding one or more additives to the water-soluble polymer in order to improve the ablation rate simply by their presence. An example of an additive that can improve the ablation rate of the water-soluble polymer includes, but is not limited to, inorganic particles such as silicon dioxide ($SiO_2$). Inorganic fillers such as $SiO_2$ have been found to modify the ablation rate. The control over the ablation rate can provide for some level of control over formation of the via holes 214 and can provide for better control over the sidewall angle of the via holes 214, e.g., relative to a top surface of the assembly 100.

Figure 3B:
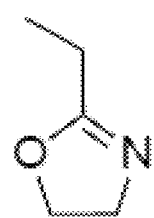
FIG. 3B is a molecular representation of a monomer that can be polymerized from a water-soluble polymer for use as a water-soluble resist, in an example embodiment.

Another example of an additive that can provide for control of the ablation rate of the water-soluble resist 202 is unreacted monomer molecules that make up the water-soluble polymer. In the example described above, the water-soluble polymer comprises poly(2-ethyl-2-oxazoline) (FIG. 3A), which can be formed from the unreacted monomer 2-ethyl-2-oxazoline (FIG. 3B). The addition of unreacted monomer can improve the ablation rate because it adds molecules having a lower molecular weight than that of the base water-soluble polymer, e.g., the addition of the unreacted monomer can lower the average overall molecular weight of the water-soluble resist 202. In this way, the addition of unreacted monomer can be similar to altering the molecular weight profile, as described above. For similar reasons, addition of the unreacted monomer can also affect the softening temperature of the water-soluble resist 202, so that it may be necessary to balance the improved ablation rate with a reduced softening temperature due to the addition of the unreacted monomer.

As also noted above, the various methods of modulating ablation rate described above can also affect the softening temperature of the water-soluble resist 202. In an example, the water-soluble resist 202 can be configured to have a softening temperature of 240° C. or higher, such as about 260° C. or higher.

The water-soluble resist 202 can also include one or more additives that improve thermal stability of the water-soluble polymer at the conditions experienced by the water-soluble resist 202 during ablation or solder reflow, also referred to herein as one or more "thermally-stabilizing additives." "Thermal stability," as used herein, can refer to the ability of the composition of the water-soluble resist 202 to resist changing phases from the solid phase to the liquid phase at a particular temperature or to resist degradation due to the temperature to which the water-soluble resist 202 is exposed. "Thermal stability," can also refer to the ability of the composition of the water-soluble resist 202 to resist deformation due to softening or melting of the water-soluble polymer, which can also be referred to as "structural integrity."

The one or more thermally-stabilizing additives can comprise filler particles such as fiber particles (e.g., particles having a length to width ratio that is greater than about 2:1, such as greater than about 3:1, for example greater than about 5:1, such as greater than about 10:1) or generally spherical or grain-like particles (e.g., particles having a length to width ratio that is less than about 2:1, for example that is about 1:1). Example of materials that can form the filler thermally-stabilizing particles include, but are not limited to: polybenzimidazole ("PBI"); inorganic particles such as $SiO_2$ or $TiO_2$, or both; carbon fiber materials; carbon nanotubes; engineering plastics, such as polyimides, polytetrafluoroethylene (PTFE), polyaryletherketones (such as polyether ketone (PEK), polyether ether ketone (PEEK), polyether ketone ether ketone ketone (PEKEKK)), polyamides such as polyaramids, polyp-phenylene oxide) (PPO) or polyp-phenylene ether) (PPE); fiberglass, ceramic fibers, and the like.

In an example, the one or more additives can result in the formation of a composite structure comprising the water-soluble polymer and the additive, such as the filler particles, dispersed in the water-soluble polymer. Without being bound by any theory, the inventors of the present subject believe that a matrix including solid filler particles dispersed in the water-soluble polymer can improve overall thermal stability of the water-soluble resist 202 by the filler particles acting as anchors that can hold together the matrix even if the water-soluble polymer has become softened or liquefied, so that the filler particles can prevent or reduce flow or other shifting of the softened or liquefied water-soluble polymer and can reinforce the structure of the matrix. For example, if the temperature necessary to reflow the solder precursor 216 to form the solder connections 108 is sufficiently high that the water-soluble polymer would begin to soften or even liquefy and deform, the presence of the filler particles can substantially maintain the structural shape of the matrix until the temperature is reduced after reflow is complete. In an example, the filler particles can have a size in their largest dimension that is less than or equal to 50 nanometers.

In another example, the thermally-stabilizing additive can comprise a stabilizing polymer that is blended with the water-soluble polymer. The stabilizing polymer can comprise a polymer that has a greater thermal stability as the water-soluble polymer, such as by having a melting point that is higher, and in some examples substantially higher, than the melting point of the water-soluble polymer, so that the effective melting point or softening point of the water-soluble resist 202 is greater than that of the water-soluble polymer by itself. In an example, the stabilizing polymer can be at least partially dissolved into the water-soluble polymer, such as by the water-soluble polymer acting as a compatibilizer for the stabilizing polymer. In an example, a stabilizing polymer that is added to the water-soluble polymer can comprise polybenzimidazole (PBI). Other stabilizing polymers may be possible, such as one or more of the polymers listed above.

The one or more thermally-stabilizing additives can be the same or a different additive from those described above for improving laser absorbance or ablation rate. For example, it has been found that the addition of inorganic particles, such as $SiO_2$ or $TiO_2$ particles, can improve the thermal stability of the water-soluble polymer, while the $SiO_2$ particles can also improve ablation rate and the $TiO_2$ particles can improve UV absorption.

As noted above, it can be beneficial for the resist 202 to be water soluble so that the resist can be easily removed after forming the solder connections 108. As further noted above, it can be desirable that the solder paste 216 also be water soluble so that any paste residue can also be removed after the formation of the solder connections 108.

In an example, a water-soluble solder paste 216 can comprise a composition comprising a solvent, an acid, a base material (e.g., that will form the solder), and optionally an amine. The base material can comprise any metal that can be used for solder joints, such as copper. It has been found that, in some circumstances, amines can interact with components within the water-soluble resist 202. Therefore, in an example, the amine can be removed from the water-soluble solder paste 216.

The base material can be in the form of a fine powder. Typically, base material powders in solder pastes have had a size on the order of 20-40 microns. However, in an example, the base material powder of the water-soluble solder paste 216 can have a size that is less than 3 micron. In such an example, the smaller particle size cab result in a higher tendency toward oxidation of the base material due to the larger relative surface area of the powder relative to the powder volume. In order to overcome the higher tendency toward oxidation, the water-soluble solder paste 216 can include a stronger acid compared to previous solder pastes.

Figure 4:
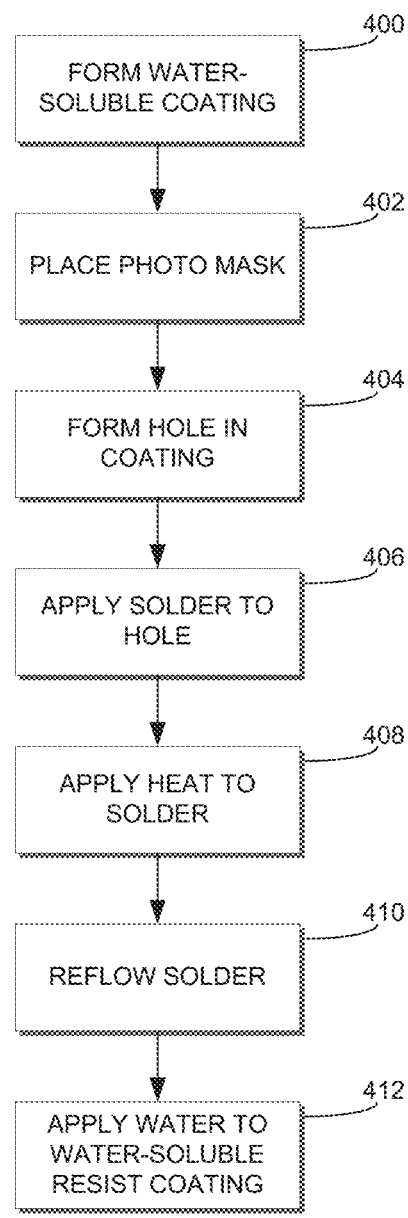
FIG. 4 is a flowchart for making an electronic assembly, in an example embodiment.

FIG. 4 is a flowchart for making an electronic assembly. The flowchart may be used to make the electronic assembly 100 or any other suitable electronic assembly.

At 400, a water-soluble coating is formed on the surface of an initial assembly.

At 402, a photo mask is placed with respect to the water-soluble resist coating, the photo mask forming a mask hole.

At 404, a hole is formed in a water-soluble resist coating. In an example, forming the hole includes applying the laser energy to ablate the water-soluble resist coating. In an example, the hole is formed via laser energy admitted through the photo mask hole contacting and ablating the water-soluble resist coating.

At 406, solder is applied to the hole. In an example, applying the solder to the hole uses solder paste printing and a height of the solder is approximately coextensive with a thickness of the water-soluble resist coating.

At 408, heat is applied to the solder as applied to the hole formed in the water-soluble resist coating, the water-soluble resist coating being on a surface of the initial assembly, the initial assembly including an electronic component, the surface formed, at least in part, by an electrical terminal of the electronic component, the hole being aligned, at least in part, with the electrical terminal.

At 410, the solder is reflowed, wherein the solder couples, at least in part, with the electrical terminal. In an example, reflowing the solder produces a solder residue, and applying water further removes, at least in part, the solder residue.

At 412, water is applied to the water-soluble resist coating, the water removing, at least in part, the water-soluble resist coating form the surface.

Figure 5:
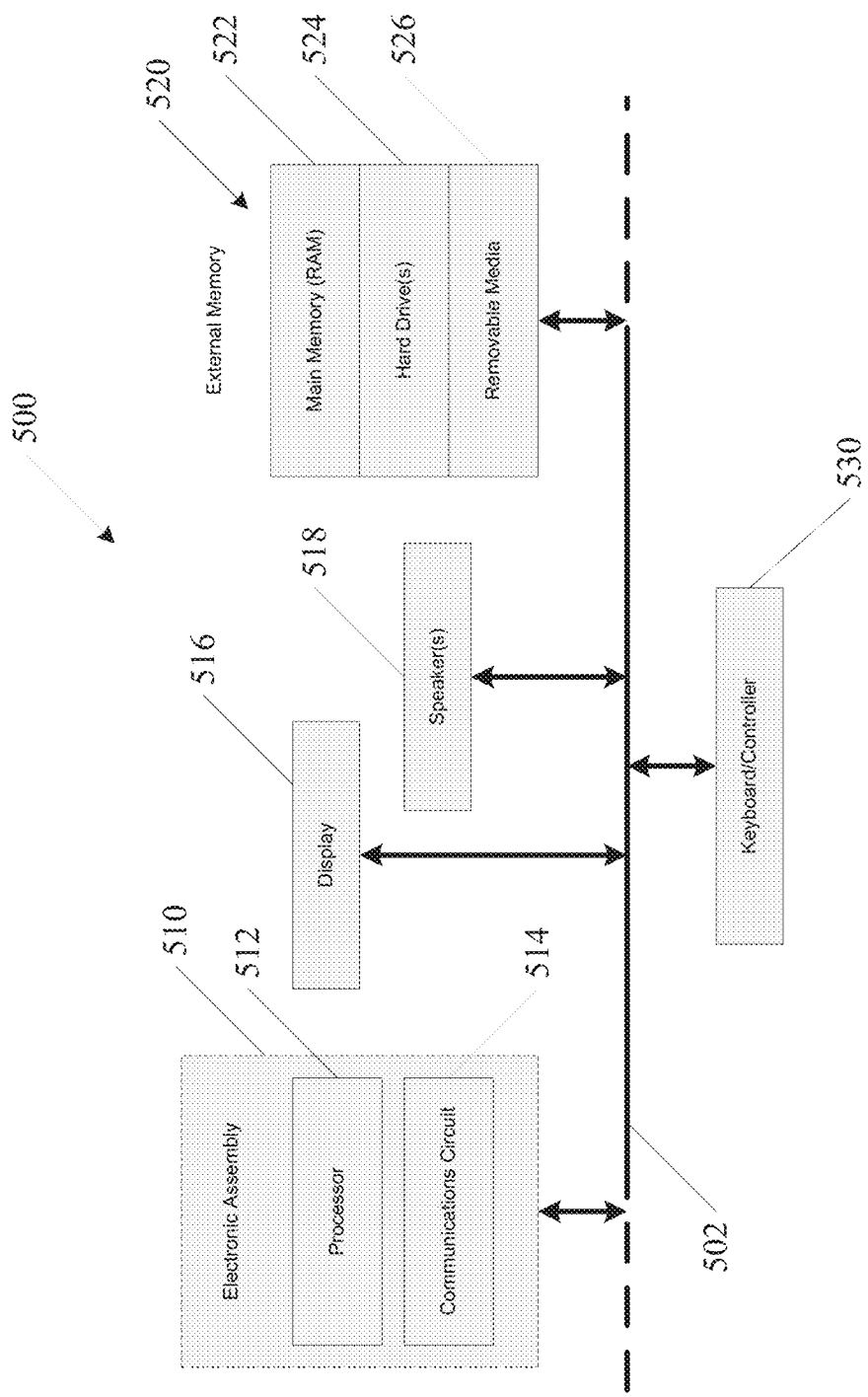
FIG. 5 is a block diagram of an electronic device incorporating at least one microelectronic assembly, in an example embodiment.

An example of an electronic device using electronic assemblies as described in the present disclosure is included to show an example of a higher level device application for the disclosed subject matter. FIG. 5 is a block diagram of an electronic device 500 incorporating at least one electronic assembly, such as an electronic assembly 100 or other electronic or microelectronic assembly related to examples herein. The electronic device 500 is merely one example of an electronic system in which embodiments of the present invention can be used. Examples of electronic devices 500 include, but are not limited to personal computers, tablet computers, mobile telephones, personal data assistants, MP3 or other digital music players, wearable devices, Internet of things (IOTS) devices, etc. In this example, the electronic device 500 comprises a data processing system that includes a system bus 502 to couple the various components of the system. The system bus 502 provides communications links among the various components of the electronic device 500 and can be implemented as a single bus, as a combination of busses, or in any other suitable manner.

An electronic assembly 510 is coupled to the system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 516, one or more speakers 518, and a keyboard and/or controller 530, which can include a mouse, trackconnection, touch screen, voice-recognition device, or any other device that permits a system user to input information into and receive information from the electronic device 500.

ADDITIONAL EXAMPLES

Example 1 may include subject matter (such as an apparatus, a method, a means for performing acts) that can include applying heat to solder as applied to a hole formed in a water-soluble resist coating, the water-soluble resist coating being on a surface of an initial assembly, the initial assembly including an electronic component, the surface formed, at least in part, by an electrical terminal of the electronic component, the hole being aligned, at least in part, with the electrical terminal and reflowing the solder, wherein the solder couples, at least in part, with the electrical terminal.

Example 2 can include the method of Example 1, further including forming the hole in the water-soluble resist coating.

Example 3 can include the method of any one or more of Examples 1 and 2, further including that forming the hole includes applying laser energy to ablate the water-soluble resist coating.

Example 4 can include the method of any one or more of Examples 1-3, further including placing a photo mask with respect to the water-soluble resist coating, the photo mask forming a mask hole configured to admit the laser energy to contact and ablate the water-soluble resist coating.

Example 5 can include the method of any one or more of Examples 1-4, further including applying water to the water-soluble resist coating, the water removing, at least in part, the water-soluble resist coating form the surface.

Example 6 can include the method of any one or more of Examples 1-5, further including reflowing the solder produces a solder residue, and wherein applying water further removes, at least in part, the solder residue.

Example 7 can include the method of any one or more of Examples 1-6, further including forming the water-soluble coating on the surface of the initial assembly.

Example 8 can include the method of any one or more of Examples 1-7, further including applying the solder to the hole.

Example 9 can include the method of any one or more of Examples 1-8, further including that applying the solder to the hole uses solder paste printing and a height of the solder is approximately coextensive with a thickness of the water-soluble resist coating.

Example 10 may include subject matter (such as an apparatus, a method, a means for performing acts) that can include an initial assembly including an electronic component, the electrical component having a terminal, a water-soluble resist coating including a hole, the water-soluble resist coating being on a surface of the initial assembly, the surface including, at least in part, an electrical terminal of the electronic component, the hole being aligned, at least in part, with the electrical terminal, and solder positioned within the hole in the water-soluble resist coating, wherein, upon application of heat at a temperature to the solder, the solder is configured to reflow and couple, at least in part, with the electrical terminal. The water-soluble resist material is substantially thermally stable at least up to the temperature.

Example 11 can include the electronic assembly of Example 10, further including that the solder is a solder paste.

Example 12 can include the method of any one or more of Examples 10 and 11, further including that the solder paste has a height approximately coextensive with a thickness of the water-soluble resist coating.

Example 13 can include the method of any one or more of Examples 10-12, further including that the solder is a solder precursor.

Example 14 can include the method of any one or more of Examples 10-13, further including that the electronic component is a silicon die.

Example 15 can include the method of any one or more of Examples 10-14, further including that the terminal is comprised of copper.

Example 16 can include the method of any one or more of Examples 10-15, further including that the solder, as reflowed, is configured to electrically and mechanically couple with the terminal.

Example 17 can include the method of any one or more of Examples 10-16, further including that the surface of the initial assembly includes the terminal and an insulator, the insulator in contact with the electronic component and surrounding, at least in part, the terminal.

Example 18 can include the method of any one or more of Examples 10-17, further including that the insulator is a dielectric configured to provide at least one of physical stability to the terminal, electrical isolation for the terminal, and mechanical isolation for the terminal.

Example 19 may include subject matter (such as an apparatus, a method, a means for performing acts) that can include a resist composition that is patternable for receiving a solder precursor for forming a solder joint on a terminal of an electronic component, the resist composition comprising a water-soluble polymer that is thermally stable up to at least about 240° C., wherein the water-soluble polymer is substantially unreactive with the solder precursor.

Example 20 can include the resist composition of Example 19, further including that the water-soluble polymer is thermally stable up to at least about 260° C.

Example 21 can include the resist composition of any one or more of Examples 19 and 20, further including that the water-soluble polymer is thermally stable at a reflow temperature of the solder precursor.

Example 22 can include the resist composition of any one or more of Examples 19-21, further including that the water-soluble polymer comprises a ring-opened polymer of a heterocyclic organic monomer comprising carbon and at least one of oxygen and nitrogen.

Example 23 can include the resist composition of any one or more of Examples 19-22, further including that the water-soluble polymer comprises a polyoxazoline.

Example 24 can include the resist composition of any one or more of Examples 19-23, further including that the water-soluble polymer composition comprises poly(2-ethyl-2-oxazoline).

Example 25 can include the resist composition of any one or more of Examples 19-24, further including a plurality of filler particles dispersed within the water-soluble polymer.

Example 26 can include the resist composition of any one or more of Examples 19-25, further including that the plurality of filler particles comprise at least one of fibers or generally-spherical particles.

Example 27 can include the resist composition of any one or more of Examples 19-26, further including that the filler particles comprise at least one of polybenzimidazole (PBI) particles, silica ($SiO_2$) particles, and titanium dioxide ($TiO_2$) particles.

Example 28 can include the resist composition of any one or more of Examples 19-27, further including that the water-soluble polymer is thermally stable to a higher temperature than a corresponding thermal stability of a corresponding polymer not including the filler particles.

Example 29 can include the resist composition of any one or more of Examples 19-28, further including that absorption of a predetermined wavelength of light in the water-soluble polymer is greater than a corresponding absorption of the predetermined wavelength of light in a corresponding polymer not including the filler particles.

Example 30 can include the resist composition of any one or more of Examples 19-29, further including that a potential laser ablation etch rate of the water-soluble polymer is greater than a corresponding laser ablation etch rate in a corresponding polymer not including the filler particles.

Example 31 can include the resist composition of any one or more of Examples 19-30, further including an unreacted monomer of the water-soluble polymer.

Example 32 may include subject matter (such as an apparatus, a method, a means for performing acts) that can include method of preparing a resist for a solder-on-die application, the method comprising obtaining or providing a solution of a water-soluble polymer in a water-based solvent, applying the solution to a surface of an electronic assembly including an electronic component having a terminal, and drying or allowing the solution to dry so that a coating of the water-soluble polymer is formed on the surface.

Example 33 can include the method of Example 32, further including that wherein the surface is a top surface of an initial assembly including an electronic component, the electrical component having a terminal.

Example 34 can include the method of any one or more of Examples 32 and 33, further including that obtaining or providing the solution of the water-soluble polymer in the water-based solvent comprises selecting a molecular-weight profile of the water-soluble polymer in the solution to correspond to at least one of: a predetermined softening temperature of the water-soluble polymer and a laser ablation etch rate of the water-soluble polymer.

Example 35 can include the method of any one or more of Examples 32-34, further including that obtaining or providing the solution of the water-soluble polymer in the water-based solvent comprises adding unreacted monomer that forms the water-soluble polymer in a proportion selected to correspond to at least one of: a predetermined softening temperature of the water-soluble polymer and a laser ablation etch rate of the water-soluble polymer.

Example 36 can include the method of any one or more of Examples 32-35, further including that the coating of the water-soluble polymer is thermally stable up to at least 240° C.

Example 37 can include the method of any one or more of Examples 32-36, further including that the water-soluble polymer comprises a ring-opened polymer of a heterocyclic organic monomer comprising carbon and at least one of oxygen and nitrogen.

Example 38 can include the method of any one or more of Examples 32-37, further including that the water-soluble polymer comprises a polyoxazoline.

Example 39 can include the method of any one or more of Examples 32-38, further including that the water-soluble polymer comprises poly(2-ethyl-2-oxazoline).

Example 40 can include the method of any one or more of Examples 32-39, further including that the solution of the water-soluble polymer in the water-based solvent further comprises a plurality of filler particles dispersed within the solution.

Example 41 can include the method of any one or more of Examples 32-40, further including that the filler particles comprise at least one of polybenzimidazole (PBI) particles, silica ($SiO_2$) particles, and titanium dioxide ($TiO_2$) particles.

Example 42 can include the method of any one or more of Examples 32-41, further including that the solution of the water-soluble polymer in the water-based solvent further comprises unreacted monomer of the water-soluble polymer.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for making an electronic assembly, comprising:
    placing a photo mask with respect to a water-soluble resist coating, the water-soluble resist coating being in contact with a surface of an initial assembly, the initial assembly including an electronic component, the surface formed, at least in part, by an electrical terminal of the electronic component, the photo mask forming a mask hole configured to admit laser energy to contact and ablate the water-soluble resist coating, the mask hole being aligned, at least in part, with the electrical terminal;
    forming a hole in a water-soluble resist coating by applying laser energy to ablate the water-soluble resist coating through the mask hole of the photo mask;
    applying heat to solder as applied to the hole formed in a water-soluble resist coating; and
    reflowing the solder, wherein the solder couples, at least in part, with the electrical terminal.

2. The method of claim 1, further comprising applying water to the water-soluble resist coating, the water removing, at least in part, the water-soluble resist coating from the surface.

3. The method of claim 2, wherein reflowing the solder produces a solder residue, and wherein applying water further removes, at least in part, the solder residue.

4. The method of claim 1, further comprising forming the water-soluble coating on the surface of the initial assembly.

5. The method of claim 1, further comprising applying the solder to the hole.

6. The method of claim 5, wherein applying the solder to the hole uses solder paste printing and a height of the solder is approximately coextensive with a thickness of the water-soluble resist coating.

* * * * *